United States Patent
Moyama

(10) Patent No.: US 12,456,613 B2
(45) Date of Patent: Oct. 28, 2025

(54) PLASMA PROCESSING SYSTEM, PLASMA PROCESSING APPARATUS, AND METHOD FOR REPLACING EDGE RING

(71) Applicant: Tokyo Electron Limited, Tokyo (JP)

(72) Inventor: Kazuki Moyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 465 days.

(21) Appl. No.: 17/352,383

(22) Filed: Jun. 21, 2021

(65) Prior Publication Data

US 2021/0398783 A1    Dec. 23, 2021

(30) Foreign Application Priority Data

Jun. 22, 2020    (JP) .................................. 2020-106756

(51) Int. Cl.
  *H01J 37/32*    (2006.01)
  *H01L 21/687*   (2006.01)

(52) U.S. Cl.
  CPC .. *H01J 37/32807* (2013.01); *H01J 37/32642* (2013.01); *H01J 37/32724* (2013.01); *H01L 21/68735* (2013.01); *H01J 2237/2007* (2013.01); *H01J 2237/334* (2013.01)

(58) Field of Classification Search
  CPC ............ C23C 16/4585; H01J 37/32513; H01J 37/32642; H01J 37/32724; H01J 37/32807; H01J 37/32889; H01J 37/32899; H01J 2237/334; H01J 2237/2007; H01L 21/67207; H01L 21/67346; H01L 21/67718; H01L 21/6831; H01L 21/68707; H01L 21/68735; H01L 21/68742
  See application file for complete search history.

(56) References Cited

U.S. PATENT DOCUMENTS

| | | | |
|---|---|---|---|
| 2002/0029745 A1 | 3/2002 | Nagaiwa et al. | |
| 2004/0002221 A1* | 1/2004 | O'Donnell | H01J 37/3255 438/710 |

(Continued)

FOREIGN PATENT DOCUMENTS

| | | |
|---|---|---|
| CN | 111312576 A | 6/2020 |
| JP | 2002-16126 A | 1/2002 |

*Primary Examiner* — Benjamin Kendall
(74) *Attorney, Agent, or Firm* — XSENSUS LLP

(57) ABSTRACT

A plasma processing apparatus includes a processing chamber, a support in the processing chamber to support an edge ring assembly that includes a heat transfer sheet that is attached to an edge ring, and the edge ring surrounding the substrate supported by support, and a delivery structure for vertically moving and transferring the edge ring assembly between the plasma processing apparatus and the pressure-reducible transfer apparatus. The transfer apparatus includes a pressure-reducible transfer chamber connected to the processing chamber, and a transferer for transferring the edge ring assembly. Without exposing the processing chamber to the atmosphere, the transferer supports the heat transfer sheet and moves the edge ring assembly to a position above the support, the delivery structure receives the edge ring assembly from the transferer and supports the heat transfer sheet, and the support receives the edge ring assembly to support the edge ring via the heat transfer sheet.

12 Claims, 11 Drawing Sheets

(56) References Cited

U.S. PATENT DOCUMENTS

| | | | | |
|---|---|---|---|---|
| 2004/0261946 | A1* | 12/2004 | Endoh | H01J 37/32642 |
| | | | | 156/345.1 |
| 2005/0205209 | A1* | 9/2005 | Mosden | H01L 21/67069 |
| | | | | 156/345.31 |
| 2008/0210379 | A1* | 9/2008 | Miyagawa | H01J 37/32642 |
| | | | | 156/345.51 |
| 2008/0236746 | A1* | 10/2008 | Oyabu | H01J 37/32642 |
| | | | | 156/345.23 |
| 2011/0031111 | A1* | 2/2011 | Kobayashi | H01J 37/32623 |
| | | | | 204/298.36 |
| 2012/0288347 | A1* | 11/2012 | Minami | H01L 21/67742 |
| | | | | 414/217 |
| 2013/0186858 | A1* | 7/2013 | Suzuki | H01L 21/68757 |
| | | | | 156/345.34 |
| 2019/0109031 | A1* | 4/2019 | Sugawara | H01J 37/32899 |
| 2019/0122870 | A1* | 4/2019 | Ishizawa | H01J 37/32862 |

* cited by examiner

PLASMA PROCESSING SYSTEM, PLASMA PROCESSING APPARATUS, AND METHOD FOR REPLACING EDGE RING

CROSS-REFERENCE TO RELATED APPLICATIONS

This application claims priority to Japanese Patent Application No. 2020-106756, filed on Jun. 22, 2020, the entire contents of which are incorporated herein by reference.

TECHNICAL FIELD

The present disclosure relates to a plasma processing system, a plasma processing apparatus, and a method for replacing an edge ring.

BACKGROUND

Japanese Patent Application Publication No. 2002-16126 discloses a substrate support device that includes a wafer chuck on which a wafer is mounted, and a focus ring disposed on a peripheral portion of a supporting surface of the wafer chuck. Further, the wafer chuck has a coolant flow path therein. In the substrate support device, a heat transfer medium is interposed between the wafer chuck and the focus ring, and a fixing unit for pressing and fixing the focus ring against the wafer chuck is provided.

SUMMARY

The present disclosure provides a technique of replacing an edge ring and a heat transfer sheet without exposing (opening) a processing chamber to the atmosphere in a plasma processing apparatus in which the heat transfer sheet is disposed between the edge ring and a substrate support.

In accordance with an aspect of the present disclosure, there is provided a plasma processing system comprising: a plasma processing apparatus configured to perform plasma processing on a substrate; and a pressure-reducible transfer apparatus connected to the plasma processing apparatus. The plasma processing apparatus includes: a pressure-reducible processing chamber; a support disposed in the processing chamber, the support having thereon an edge ring assembly that includes a heat transfer sheet that is attached to an edge ring, and the edge ring surroundings the substrate supported by the support; and a delivery structure to vertically move the edge ring assembly to transfer the edge ring assembly between the plasma processing apparatus and the pressure-reducible transfer apparatus. The pressure-reducible transfer apparatus includes: a pressure-reducible transfer chamber connected to the processing chamber; and a transferer to transfer the edge ring assembly between the processing chamber and the pressure-reducible transfer chamber. Without exposing the processing chamber to the atmosphere, the transferer supports the heat transfer sheet of the edge ring assembly and moves the edge ring assembly to a position above the support, the delivery structure receives the edge ring assembly from the transferer and supports the heat transfer sheet of the edge ring assembly, and the support receives the edge ring assembly from the delivery structure such that the edge ring is placed on the support via the heat transfer sheet.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
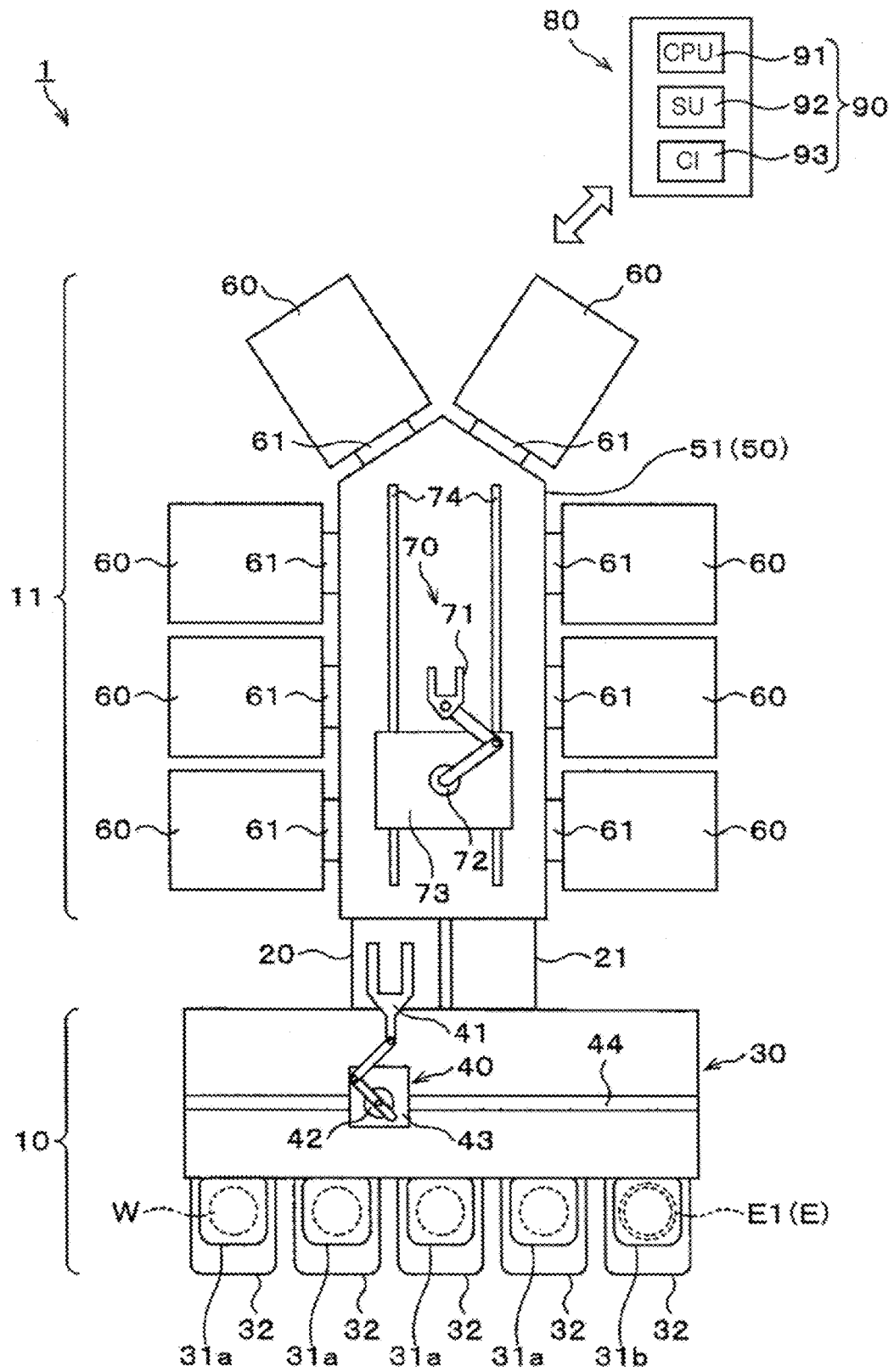
FIG. 1 is a plan view showing a schematic configuration of a plasma processing system according to an embodiment.

In a process of manufacturing semiconductor devices, plasma processing such as etching is performed using plasma on a substrate such as a semiconductor wafer (hereinafter referred to as "wafer"). This plasma processing is performed in a state where the substrate is placed on a substrate support in a pressure-reduced processing chamber.

In order to obtain an accurate and uniform plasma processing result at a central portion and a peripheral portion of the substrate, a structure (also referred to as a member) having an annular shape in plan view, which is so-called a focus ring or an edge ring (hereinafter referred to as "edge ring"), may be placed on the substrate support to surround a periphery of the substrate on the substrate support.

Further, a temperature adjuster adjusts a temperature of the substrate support and also adjusts a temperature of the substrate to a desired temperature via the substrate support.

A temperature of the edge ring is also controlled via the substrate support. However, in the pressure-reduced processing chamber, when the edge ring is placed on the substrate support, a vacuum heat insulating layer is formed between the substrate support and the edge ring and, thus, heat transfer therebetween becomes poor. Therefore, it is difficult to adjust the temperature of the edge ring to a desired temperature via the substrate support.

To this end, a technique for providing a heat transfer sheet between the edge ring and the substrate support has been proposed (see, e.g., Japanese Patent Application Publication No. 2002-16126).

In the conventional case, when the edge ring is consumed and requires replacement, the processing chamber is exposed to the atmosphere and an operator manually replaces the edge ring. However, once the processing chamber is exposed to the atmosphere, a long period of time is required to restart the plasma processing after the replacement.

Further, in the case of providing the heat transfer sheet between the edge ring and the substrate support as disclosed in Japanese Patent Application Publication No. 2002-16126, the heat transfer sheet is also replaced when the edge ring is replaced. This is because the heat transfer sheet deteriorates by the plasma processing.

Therefore, the present disclosure provides a technique of replacing the edge ring and the heat transfer sheet without exposing the processing chamber to the atmosphere in the plasma processing apparatus in which the heat transfer sheet is disposed between the edge ring and the substrate support.

Hereinafter, a plasma processing system, a plasma processing apparatus, and a method for replacing an edge ring of the present embodiment will be described with reference to the accompanying drawings. Like reference numerals will be given to like parts having substantially the same functions throughout the specification and the drawings, and redundant description thereof will be omitted.

Figure 2:
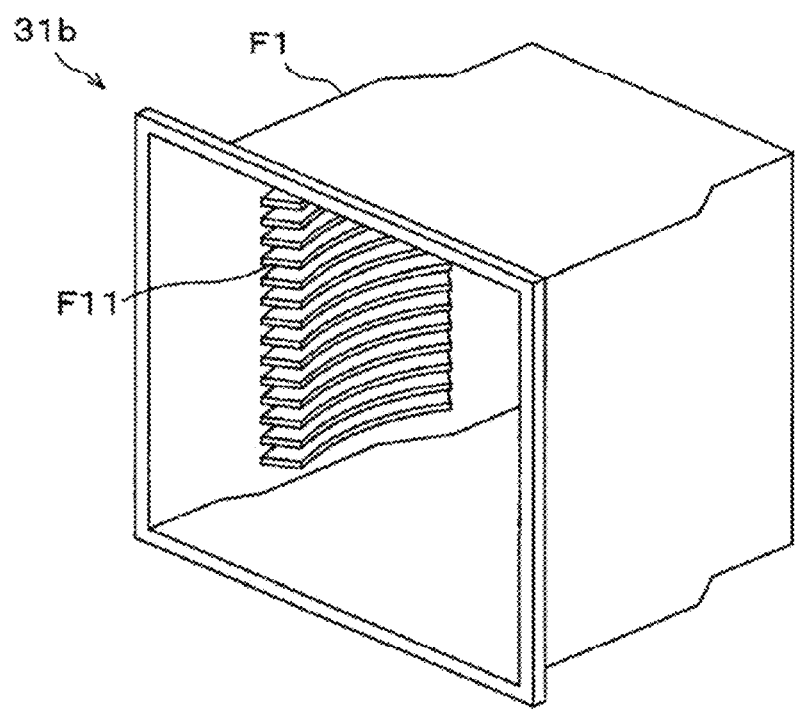
FIG. 2 is a perspective view showing a schematic configuration of a container.
Figure 3:
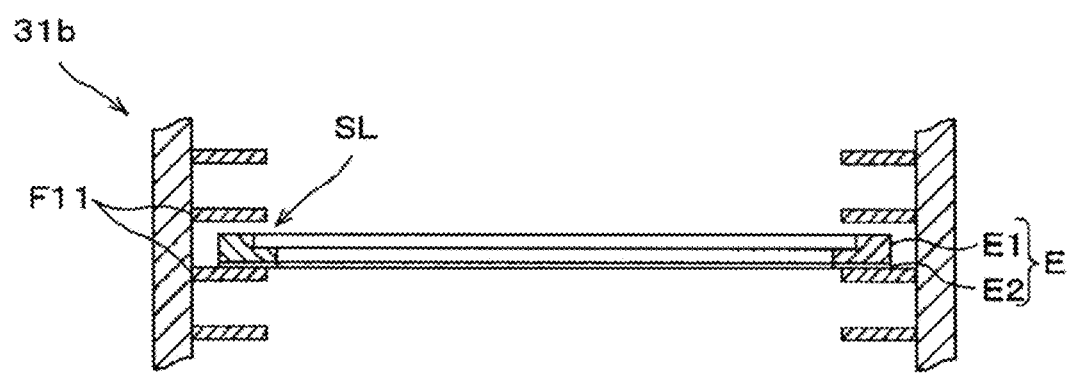
FIG. 3 is a partially enlarged cross-sectional view showing the schematic configuration of the container.
Figure 4:
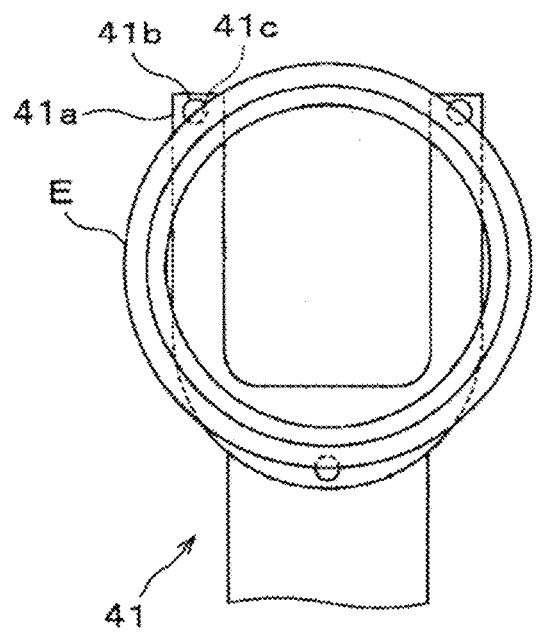
FIG. 4 is a top view showing a schematic configuration of a transfer arm.
Figure 5:
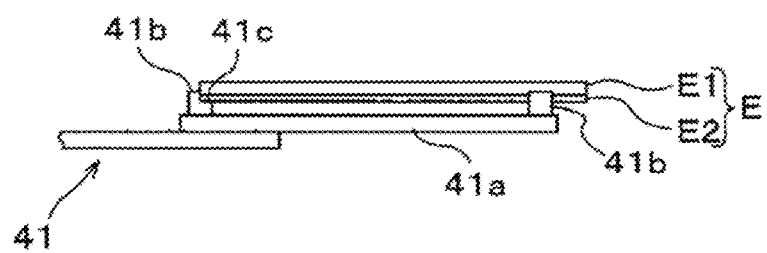
FIG. 5 is a side view showing the schematic configuration of the transfer arm.

FIG. 1 is a plan view showing a schematic configuration of the plasma processing system of the present embodiment. FIGS. 2 and 3 are respectively a perspective view and a partially enlarged cross-sectional view, each showing a schematic configuration of a container to be described later. FIGS. 4 and 5 are respectively a top view and a side view, each showing a schematic configuration of a transfer arm to be described later.

In the plasma processing system 1 of FIG. 1, plasma processing such as etching is performed on a wafer W serving as a substrate.

As shown in FIG. 1, the plasma processing system 1 includes an atmospheric section 10 and a decompression section 11, and the atmospheric section 10 and the decompression section 11 are integrally connected to each other through load-lock modules 20 and 21. The atmospheric section 10 includes an atmospheric module for performing desired processing on the wafer W under an atmospheric pressure atmosphere. The decompression section 11 includes a processing module 60 for performing desired processing on the wafer W under a pressure-reduced atmosphere (vacuum atmosphere).

The load-lock modules 20 and 21 are connected to a loader module 30 of the atmospheric section 10 and a transfer module 50 of the decompression section 11 through gate valves. The load-lock modules 20 and 21 are configured to temporarily hold the wafer W or an edge ring assembly E (see, e.g., FIG. 3) formed by attaching a heat transfer sheet E2 to an edge ring E1. For example, the load-lock modules 20 and 21 have support pins that are rod-shaped members for supporting the heat transfer sheet E2 side of the edge ring assembly E. Further, each of the load-lock modules 20 and 21 is configured such that an inner space thereof can be switched between an atmospheric pressure atmosphere and a pressure-reduced atmosphere.

The atmospheric section 10 includes the loader module 30 serving as an atmospheric transferer (also referred to as an atmospheric transfer device) provided with a transferer referred to as a transfer device) 40 to be described later, and a load port 32 as a container mounter on which containers 31a and 31b are placed. The container 31a is configured to store a plurality of wafers W. Further, the container 31a can be transferred by a transfer device such as an overhead hoist transfer (OHT) disposed outside the plasma processing system 1. Similarly, the container 31b is configured to store a plurality of edge rings E1. Further, the container 31b can be transferred by the transfer device such as an OHT.

Specifically, the container 31b is configured to store a plurality of edge ring assemblies E in an atmospheric pressure atmosphere. As shown in FIG. 2, the container 31b has a box-shaped body F1 having a front opening and a lid for closing the opening of the body F1. As shown in FIG. 3, multiple shelves F11 are arranged along a vertical direction on both side walls of the body F1. For example, the edge ring assembly E is stored in the container 31b in a state where a peripheral portion of the heat transfer sheet E2 is supported by a shelf F11 on one sidewall and a shelf F11 of the same height on the other sidewall. In other words, in the container 31b, a space between the vertically adjacent shelves F11 serves as a slot SL into which the edge ring assembly E is inserted, and the heat transfer sheet E2 side of the edge ring assembly E is supported on an upper surface of the lower shelf F11 forming the slot SL.

In the container 31b, the surface that supports the heat transfer sheet E2 of the edge ring assembly E, i.e., the upper surface of the shelf F11, may be subjected to peelability improving treatment to be described later.

Referring back to the description of the loader module 30, an orienter that adjusts the horizontal orientation of the wafer W or the edge ring assembly E and a buffer module that temporarily stores a plurality of wafers W may be connected to the loader module 30.

The loader module 30 has a rectangular housing, and an inner space of the housing is maintained in an atmospheric pressure atmosphere. As shown in FIG. 1, a plurality of, for example, five load ports 32 are disposed side by side on one longitudinal side of the housing of the loader module 30. The load-lock modules 20 and 21 are disposed side by side on the other longitudinal side the housing of the loader module 30.

The transfer device 40 configured to transfer the wafer W and/or the edge ring assembly E is disposed in the loader module 30. The transfer device 40 includes a transfer arm 41 that supports the wafer W and/or the edge ring assembly E, a rotor 42 that rotatably supports the transfer arm 41, and a base 43 on which the rotor 42 is placed. Further, a guide rail 44 extending in the longitudinal direction of the loader module 30 is disposed in the loader module 30. The base 43 is disposed on the guide rail 44, and the transfer device 40 is configured to be movable along the guide rail 44.

As shown in FIG. 4, the transfer arm 41 has a transfer pick 41a at a tip end thereof. The transfer pick 41a serves as a support portion for supporting the edge ring assembly E. Further, the transfer pick 41a may support the wafer W. As shown in FIG. 5, for example, the transfer pick 41a supports the heat transfer sheet E2 of the edge ring assembly E. Specifically, the transfer pick 41a has, e.g., three or more (three in FIG. 4) columnar members 41b, each having a notch, and the heat transfer sheet E2 of the edge ring assembly E is supported on upper surfaces 41c of the notches of the columnar members 41b. The surface of the transfer arm 41 that supports the heat transfer sheet E2 of the edge ring assembly E, i.e., the upper surfaces 41c of the notches of the columnar members 41b may be subjected to the peelability improving treatment to be described later.

As shown in FIG. 1, the decompression section 11 includes the transfer module 50 serving as a pressure-reducible transfer apparatus for transferring the wafer W and/or the edge ring assembly E, and the processing module 60 as a plasma processing apparatus that performs desired plasma processing on the wafer W transferred from the transfer module 50. An inner space of each of the transfer module 50 and the processing module 60 (specifically, an inner space of each of a pressure-reducible transfer chamber 51 and a plasma processing chamber 100 to be described later) is maintained in a pressure-reduced atmosphere. A plurality of processing modules 60, for example, eight processing modules 60 are provided for one transfer module 50. The number and the arrangement of the processing modules 60 are not limited to those described in the present embodiment and may be arbitrarily set as long as at least one processing module that requires the replacement of the edge ring assembly E is provided.

The transfer module 50 includes the pressure-reducible transfer chamber 51 having a polygonal (pentagonal shape in the illustrated example) housing. The pressure-reducible transfer chamber 51 is connected to the load-lock modules 20 and 21. The transfer module 50 is configured to transfer the wafer W loaded into the load-lock module 20 to one processing module 60, and the wafer W subjected to the desired plasma processing in the processing module 60 to the atmospheric section 10 through the load-lock module 21. Further, the transfer module 50 is configured to transfer the edge ring assembly E loaded into the load-lock module 20 to one processing module 60, and transfer the edge ring assembly E that is a replacement target in the processing module 60 to the atmospheric section 10 through the load-lock module 21.

Each processing module 60 performs plasma processing such as etching on the wafer W. Further, the processing modules 60 are connected to the transfer module 50 through gate valves 61. The configuration of the processing modules 60 will be described later.

A transfer device 70 that is configured to transfer the wafer W and/or the edge ring assembly E is disposed in the pressure-reducible transfer chamber 51 of the transfer module 50. Similar to the above-described transfer device 40, the transfer device 70 includes a transfer arm 71 that supports the wafer W and/or the edge ring assembly E during the transfer operation, a rotor 72 that rotatably supports the transfer arm 71, and a base 73 on which the rotor 72 is placed. Further, guide rails 74 extending in the longitudinal direction of the transfer module 50 are disposed in the transfer module 50. The base 73 is disposed on the guide rails 74, and the transfer device 70 is configured to be movable along the guide rails 74.

The transfer arm 71 has a transfer pick at a tip end thereof that is similar to the above-described transfer pick 41*a*. The transfer pick supports the heat transfer sheet E2 of the edge ring assembly E or support the wafer W.

The surface of the transfer arm 71 that supports the heat transfer sheet E2 of the edge ring assembly E may also be subjected to the peelability improving treatment.

Figure 6:
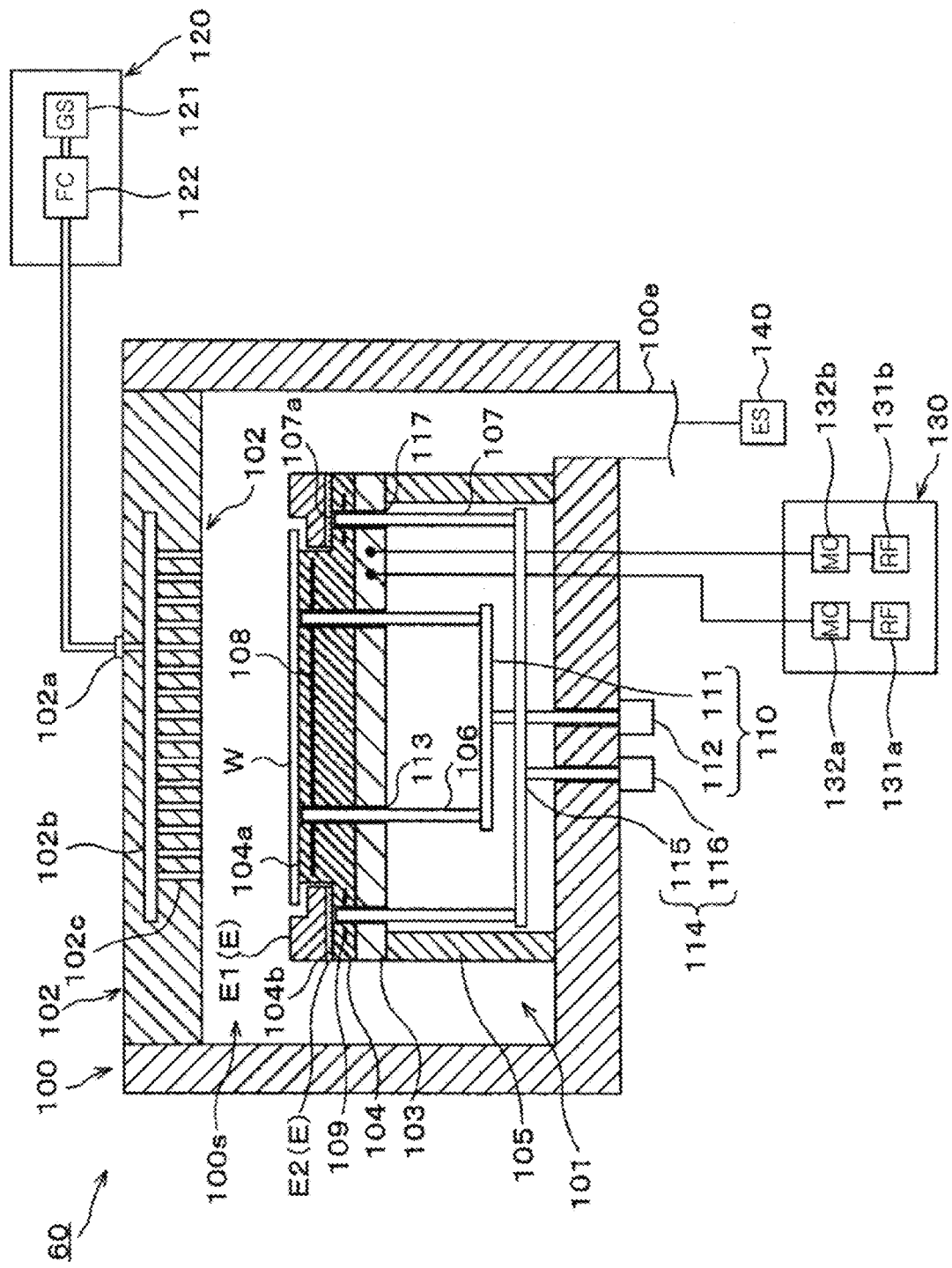
FIG. 6 is a vertical cross-sectional view showing a schematic configuration of a processing module.

Further, as an example of the transfer pick 41*a* and/or the transfer pick of the transfer arm 71, transfer picks shown in FIGS. 4 to 6 disclosed in U.S. Patent Publication No. 2018/0019107A may be used. The disclosed transfer pick has a plurality of protrusions that hold the outer peripheral portion of the wafer W. Each of the protrusions has, for example, a truncated cone shape. A tapered portion of each of the truncated cone-shaped protrusions contacts the outer peripheral portion of the wafer W to prevent misalignment of the wafer W with the transfer pick. Further, an upper surface of each of the truncated cone shaped-protrusions contacts a bottom surface of the edge ring assembly E so that the protrusions can support the edge ring assembly E.

In the transfer module 50, the wafer W or the edge ring assembly E held in the load-lock module 20 is received by the transfer arm 71 and transferred into the processing module 60. Further, the wafer W or the edge ring assembly E held in the processing module 60 is received by the transfer arm 71 and transferred into the load-lock module 21.

The plasma processing system 1 further includes a controller 80. In one embodiment, the controller 80 processes computer-executable instructions for causing the plasma processing system 1 to execute various processes described in the present disclosure. The controller 80 may be configured to control individual components of the plasma processing system 1 to execute various processes described herein. In one embodiment, the controller 80 may be partially or entirely included in the components of the plasma processing system 1. For example, the controller 80 may include a computer 90. For example, the computer 90 may include a central processing unit (CPU) 91, a storage unit (SU) 92, and a communication interface (CI) 93. The CPU 91 may be configured to perform various control operations based on a program stored in the storage unit 92. The storage unit 92 may include a random access memory (RAM), a read only memory (ROM), a hard disk drive (HDD), a solid state drive (SSD), or a combination thereof. The communication interface 93 may communicate with the components of the plasma processing system 1 through a communication line such as a local area network (LAN).

Next, the wafer processing performed using the plasma processing system 1 configured as described above will be described.

First, a wafer W is extracted from a desired container 31*a* by the transfer device 40 and loaded into the load-lock module 20. Then, the load-lock module 20 is sealed and a pressure therein is reduced. Thereafter, the inner space of the load-lock module 20 communicates with the inner space of the transfer module 50.

Next, the wafer W is held by the transfer device 70 and transferred from the load-lock module 20 to the transfer module 50.

Next, the gate valve 61 is opened, and the wafer W is loaded into a desired processing module 60 by the transfer device 70. Then, the gate valve 61 is closed, and the wafer W is subjected to desired processing in the processing module 60. The processing performed on the wafer W in the processing module 60 will be described later.

Next, the gate valve 61 is opened, and the wafer W is unloaded from the processing module 60 by the transfer device 70. Then, the gate valve 61 is closed.

Next, the wafer W is loaded into the load-lock module 21 by the transfer device 70. When the wafer W is loaded into the load-lock module 21, the load-lock module 21 is sealed and exposed to the atmosphere. Then, the inner space of the load-lock module 21 communicates with the inner space of the loader module 30.

Next, the wafer W is held by the transfer device 40, returned from the load-lock module 21 to the desired container 31*a* through the loader module 30, and accommodated in the desired container 31*a*. In this manner, a series of wafer processing in the plasma processing system 1 is completed.

Figure 7:
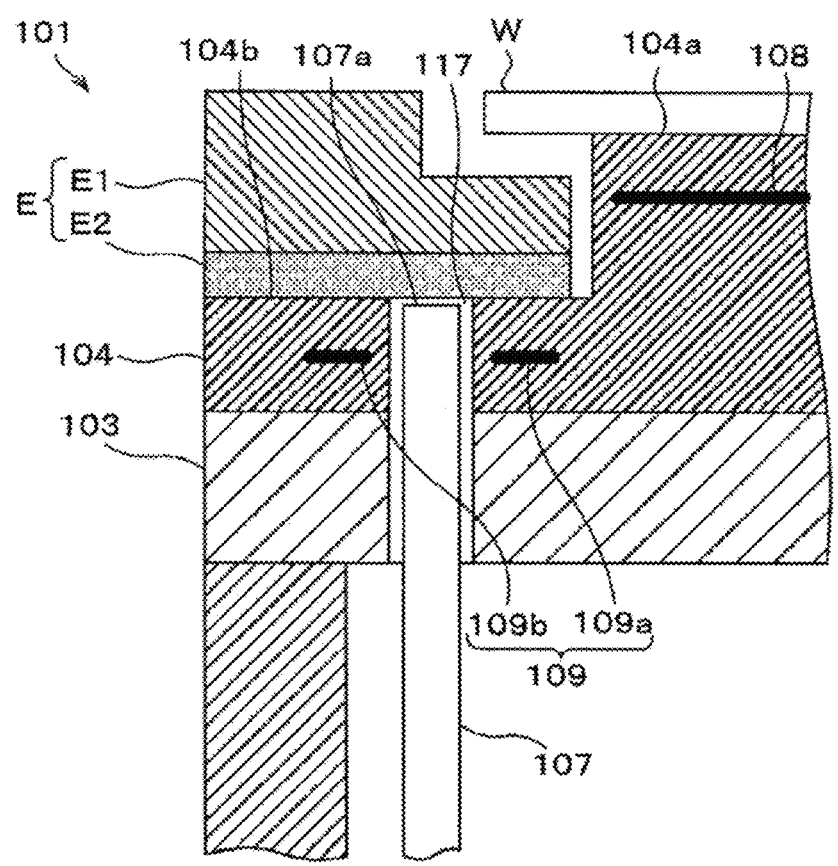
FIG. 7 is a partially enlarged view of FIG. 6.

Next, the processing module 60 will be described with reference to FIGS. 6 and 7. FIG. 6 is a vertical cross-sectional view showing a schematic configuration of the processing module 60. FIG. 7 is a partially enlarged view of FIG. 6.

As shown in FIG. 6, the processing module 60 includes a plasma processing chamber 100 serving as a processing container, a gas supply unit 120, a radio frequency (RF) power supply unit 130, and an exhaust system (ES) 140. The processing module 60 further includes a wafer support 101 serving as a substrate support and an upper electrode 102.

The wafer support 101 is disposed in a lower region of a plasma processing space 100*s* in the pressure-reducible plasma processing chamber 100. The upper electrode 102 is disposed above the wafer support 101 and may function as a part of a ceiling of the plasma processing chamber 100.

The wafer support 101 is configured to support the wafer W in the plasma processing space 100*s*. In one embodiment, the wafer support 101 includes a lower electrode 103, an electrostatic chuck 104, an insulator 105, and lifting pins 106 and 107. Although it is not illustrated, the wafer support 101 may include a temperature controller (also referred to as a temperature control device) configured to adjust a temperature of at least one of the electrostatic chuck 104 and the wafer W to a target temperature. Further, the wafer support 101 may include a temperature control device configured to adjust a temperature of the edge ring E1 independently of the wafer W to a target temperature. The temperature control device may include a heater, a flow path, or a combination thereof. A temperature control fluid such as a coolant or a heat transfer gas flows through the flow path.

The lower electrode 103 is made of a conductive material such as aluminum or the like. In one embodiment, the above-described temperature control device may be disposed at the lower electrode 103.

The electrostatic chuck 104 is disposed on the lower electrode 103 and attracts and holds both the wafer W and the edge ring E1 by an electrostatic force. An upper surface of a central portion of the electrostatic chuck 104 is formed to be higher than an upper surface of a peripheral portion of the electrostatic chuck 104. The upper surface of the central portion of the electrostatic chuck 104 serves as a wafer supporting surface 104a on which the wafer W is placed. The upper surface of the peripheral portion of the electrostatic chuck 104 serves as a ring supporting surface 104b on which the edge ring E1 is placed.

The edge ring E1 is an annular member disposed to surround the wafer W placed on the wafer supporting surface 104a of the central portion of the electrostatic chuck 104. The edge ring E1 is made of conductive silicon (Si) or silicon carbide (SiC), or may be made of insulating silicon dioxide ($SiO_2$) or the like. The edge ring E1 is placed on the ring supporting surface 104b via the heat transfer sheet E2.

The heat transfer sheet E2 is a sheet-shaped member having an annular shape in plan view. Specifically, the heat transfer sheet E2 has an outer diameter smaller than or equal to an outer diameter of the edge ring E1 and has an inner diameter greater than or equal to an inner diameter of the edge ring E1.

Further, the heat transfer sheet E2 has high thermal conductivity of, for example, 0.2 to 5 W/m·K and high elasticity. For example, the heat transfer sheet E2 contains a heat-resistant organic material as a base material. A heat transfer filler is mixed and dispersed in the base material. The heat-resistant organic material is, for example, a heat-resistant adhesive and/or rubber containing a silicon component. The heat transfer filler is, for example, alumina particles.

The heat transfer sheet E2 becomes in a gel state and has adhesiveness when it is attached to the edge ring E1, for example. The heat transfer sheet E2 is attached to the edge ring E1 due to its adhesiveness (adhesive strength).

In the present embodiment, the heat transfer sheet E2 is attached to the edge ring E1 in advance. Then, the edge ring E1 is placed on the ring supporting surface 104b such that the heat transfer sheet E2 of the edge ring assembly E to which the heat transfer sheet E2 is attached is supported on the ring supporting surface 104b. Further, in the present embodiment, the edge ring E1 is separated and replaced together with the heat transfer sheet E2 in the form of the edge ring assembly E from the ring supporting surface 104b.

The surface of the wafer support 101 that supports the heat transfer sheet E2 of the edge ring assembly E, i.e., the ring supporting surface 104b, may be subjected to the peelability improving treatment to be described later.

An electrode 108 for electrostatically attracting and holding the wafer W is disposed in the central portion of the electrostatic chuck 104, and an electrode 109 for electrostatically attracting and holding the edge ring E1 is disposed in the peripheral portion of the electrostatic chuck 104. The electrostatic chuck 104 has a structure in which the electrodes 108 and 109 are interposed between insulating members made of an insulating material.

A DC voltage from a DC power supply is applied to the electrode 108. Due to the electrostatic force thus generated, the wafer W is attracted and held on the upper surface 104a of the central portion of the electrostatic chuck 104. Similarly, a DC voltage from a DC power supply is applied to the electrode 109. Due to the electrostatic force thus generated, the edge ring E1 is attracted and held on the upper surface 104b of the peripheral edge of the electrostatic chuck 104. As shown in FIG. 3, the electrode 109 is a bipolar electrode including a pair of electrodes 109a and 109b.

In the present embodiment, the central portion of the electrostatic chuck 104 on which the electrode 108 is disposed and the peripheral portion of the electrostatic chuck 104 on which the electrode 109 is disposed are integrated with each other. However, the central portion and the peripheral portion may be separately formed.

Further, in the present embodiment, the electrode 109 for attracting and holding the edge ring E1 is a bipolar electrode. However, the electrode 109 may be a unipolar electrode.

Further, the wafer supporting surface 104a of the electrostatic chuck 104 has a diameter smaller than a diameter of the wafer W, for example. Thus, when the wafer W is placed on the wafer supporting surface 104a, the peripheral portion of the wafer W horizontally protrudes outward from the central portion of the electrostatic chuck 104.

Further, the edge ring E1 has a stepped portion formed on an upper portion thereof, and an upper surface of an outer peripheral portion of the edge ring E1 is formed to be higher than an upper surface of an inner peripheral portion of the edge ring E1. The inner peripheral portion of the edge ring E1 is positioned below the peripheral portion of the wafer W that horizontally protrudes outward from the central portion of the electrostatic chuck 104. In other words, an inner diameter of the edge ring E1 is smaller than an outer diameter of the wafer W.

Although it is not illustrated, a gas supply hole is formed at the wafer supporting surface 104a of the electrostatic chuck 104 to supply therethrough a heat transfer gas to a backside of the wafer W placed on the wafer supporting surface 104a. The heat transfer gas from a gas supply unit is supplied through the gas supply hole. The gas supply unit may include one or more gas sources and one or more pressure controllers. In one embodiment, the gas supply unit is configured to supply the heat transfer gas from the gas source to the heat transfer gas supply hole through the pressure controller.

On the other hand, no gas supply hole is formed at the ring supporting surface 104b of the electrostatic chuck 104.

The insulator 105 is a cylindrical member made of ceramic or the like, and supports the lower electrode 103. For example, the insulator 105 has an outer diameter equal to an outer diameter of the lower electrode 103 and supports a peripheral portion of the lower electrode 103.

The lifting pins 106 are columnar members that are vertically moved to protrude beyond and retreat below the wafer supporting surface 104a of the electrostatic chuck 104. Each of the lifting pins 106 is made of, for example, ceramic. Three or more lifting pins 106 are spaced apart from each other at intervals along a circumferential direction of the electrostatic chuck 104, that is, a circumferential direction of the wafer supporting surface 104a. The lifting pins 106 are spaced apart from each other at equal intervals along the circumferential direction. The lifting pins 106 are formed to extend in the vertical direction.

The lifting pins 106 are connected to a lifter 110 that vertically moves the lifting pins 106. For example, the lifter 110 includes a support member 111 that supports the lifting pins 106, and a driving unit 112 that generates a driving force to vertically move the support member 111 to raise and lower the lifting pins 106. The driving unit 112 includes a driving assembly or a driving mechanism (e.g., an actuator, a motor and/or other devices) that generates the driving force.

The lifting pins 106 are inserted into through-holes 113 extending downward from the wafer supporting surface 104a of the electrostatic chuck 104 up to a bottom surface of the lower electrode 103. In other words, the through-holes 113 are formed through the central portion of the electrostatic chuck 104 and the lower electrode 103.

The upper end surfaces of the lifting pins 106 support the backside of the wafer W when the lifting pins 106 are raised.

The lifting pins 107 are columnar members that are vertically moved to protrude beyond and retreat below the ring supporting surface 104b of the electrostatic chuck 104. Each of the lifting pins 107 is made of, for example, alumina, quartz, SUS, or the like. Three or more lifting pins 107 are spaced apart from each other at intervals along the circumferential direction of the electrostatic chuck 104, that is, the circumferential direction of the wafer supporting surface 104a and the ring supporting surface 104b. For example, the lifting pins 107 are spaced apart from each other at equal intervals along the circumferential direction. The lifting pins 107 are formed to extend in the vertical direction. The lifting pins 107 are arranged such that upper end surfaces thereof are located on the same plane, for example.

The lifting pins 107 are connected to a lifter 114 that drives the lifting pins 107. For example, the lifter 114 includes a support member 115 that supports the lifting pins 107, and a driving unit 116 that generates a driving force to vertically move the support member 115 to raise and lower the lifting pins 107. The driving unit 116 includes a motor that generates the driving force.

The lifting pins 107 are inserted into through-holes 117 which extend downward from the ring supporting surface 104b of the electrostatic chuck 104 to the bottom surface of the lower electrode 103. In other words, the through-holes 117 are formed through the peripheral portion of the electrostatic chuck 104 and the lower electrode 103.

The lifting pins 107 are delivery structures for supporting and vertically moving the edge ring E1 to transfer the edge ring E1 (specifically, the edge ring assembly E) between the processing module 60 and the transfer module 50. The upper end surfaces of the lifting pins 107 support the heat transfer sheet E2 of the edge ring assembly E.

The surfaces of the lifting pins 107 that support the heat transfer sheet E2 of the edge ring assembly E, i.e., upper end surfaces 107a of the lifting pins 107 may be subjected to the peelability improving treatment to be described later.

The upper electrode 102 also functions as a shower head configured to supply one or more processing gases from the gas supply unit 120 to the plasma processing space 100s. In one embodiment, the upper electrode 102 has a gas inlet 102a, a gas diffusion space 102b, and a plurality of gas outlets 102c. For example, the gas inlet 102a is in fluid communication with the gas supply unit 120 and the gas diffusion space 102b. The gas outlets 102c are in fluid communication with the gas diffusion space 102b and the plasma processing space 100s. In one embodiment, the upper electrode 102 is configured to supply one or more processing gases from the gas inlet 102a to the plasma processing space 100s through the gas diffusion space 102b and the gas outlets 102c.

The gas supply unit 120 may include one or more gas sources (GS) 121 and one or more flow controller (FC) 122. In one embodiment, for example, the gas supply unit 120 is configured to supply one or more processing gases from the corresponding gas sources 121 to the gas inlet 102a through the corresponding flow rate controllers 122. For example, each of the flow rate controllers 122 may include a mass flow controller or a pressure-control type flow controller. Further, the gas supply unit 120 may include one or more flow modulation devices for modulating or pulsating the gas flow of one or more processing gases.

The RF power supply unit 130 is configured to supply an RF power, for example, one or more RF signals, to one or more electrodes such as the lower electrode 103, the upper electrode 102, or both the lower electrode 103 and the upper electrode 102. Therefore, plasma is generated from one or more processing gases supplied to the plasma processing space 100s. Accordingly, the RF power supply unit 130 may function as at least a part of a plasma generation unit configured to generate plasma from one or more processing gases in the plasma processing chamber. For example, the RF power supply unit 130 includes two RF generation units (RF) 131a and 131b and two matching circuits (MC) 132a and 132b. In one embodiment, the RF power supply unit 130 is configured to supply a first RF signal from the first RF generation unit 131a to the lower electrode 103 through the first matching circuit 132a. For example, the first RF signal may have a frequency within a range of 27 MHz to 100 MHz.

Further, in one embodiment, the RF power supply unit 130 is configured to supply a second RF signal from the second RF generation unit 131b to the lower electrode 103 through the second matching circuit 132b. For example, the second RF signal may have a frequency within a range of 400 kHz to 13.56 MHz. Alternatively, a direct current (DC) pulse generation unit may be used instead of the second RF generation unit 131b.

Although it is not illustrated, other embodiments may be considered in the present disclosure. For example, in an alternative embodiment, the RF power supply unit 130 may be configured to supply the first RF signal from the RF generation unit to the lower electrode 103, supply the second RF signal from another RF generation unit to the lower electrode 103, and supply a third RF signal from still another RF generation unit to the lower electrode 103. In addition, in another alternative embodiment, a DC voltage may be applied to the upper electrode 102.

Further, in various embodiments, amplitudes of one or more RF signals (that is, the first RF signal, the second RF signal, and the like) may be pulsated or modulated. The amplitude modulation may include pulsating the RF signal amplitude between an ON state and an OFF state, or between two or more different ON states.

The exhaust system 140 may be connected to, for example, an exhaust port 100e disposed at a bottom portion of the plasma processing chamber 100. The exhaust system 140 may include a pressure valve and a vacuum pump. The vacuum pump may include a turbo molecular pump, a roughing pump or a combination thereof.

Next, an example of the wafer processing performed by the processing module 60 will be described. In the processing module 60, the wafer W is subjected to processing such as etching, film formation, or the like.

First, the wafer W is loaded into the plasma processing chamber 100, and the wafer W is placed on the electrostatic chuck 104 by vertically moving the lifting pins 106. Then, a DC voltage is applied to the electrode 108 of the electrostatic chuck 104, and thus the wafer is electrostatically attracted and held on the electrostatic chuck 104 by an electrostatic force. Further, after the wafer W is loaded, the pressure in the plasma processing chamber 100 is reduced to a predetermined vacuum level by the exhaust system 140.

Next, the processing gas is supplied from the gas supply unit 120 to the plasma processing space 100s through the upper electrode 102. Further, the RF power supply unit 130 supplies RF power HF for plasma generation to the lower electrode 103. Accordingly, the processing gas is excited to generate plasma. At this time, the RF power supply unit 130 may supply RF power LF for ion attraction. Then, the wafer W is subjected to plasma processing by the action of the generated plasma.

In order to end the plasma processing, the supply of the RF power HF from the RF power supply unit 130 and the supply of the processing gas from the gas supply unit 120 are stopped. When the RF power LF is supplied during the plasma processing, the supply of the RF power LF is also stopped. Next, the application of the DC voltage to the electrode 108 is stopped, and the attraction and holding of the wafer W on the electrostatic chuck 104 is stopped.

Then, the wafer W is raised by the lifting pins 106 and separated from the electrostatic chuck 104. During the separation, charge neutralization of the wafer W may be performed. Then, the wafer W is unloaded from the plasma processing chamber 100, and a series of wafer processing is completed.

Next, an example of a process of replacing the edge ring E1 in the processing module 60 performed in the plasma processing system 1, particularly an example of the installation process of the edge ring E1, will be described. The following processes are performed under the control of the controller 80.

First, the transfer pick 41a of the transfer device 40 is inserted into the container 31b and raised in the container 31b to support the heat transfer sheet E2 of the edge ring assembly E for replacement. Next, the transfer pick 41a is retreated from the container 31b, inserted into the load-lock module 20, and lowered in the load-lock module 20. Accordingly, the support pins in the load-lock module 20 receive the edge ring assembly E from the transfer device 40 and support the heat transfer sheet E2 of the edge ring assembly E. Then, the transfer pick 41a is retreated, and the load-lock module 20 is sealed and a pressure therein is reduced. Thereafter, the inner space of the load-lock module 20 communicates with the inner space of the transfer module 50.

Next, the transfer arm 71 (transfer pick) of the transfer device 70 is inserted into the load-lock module 20 and raised in the load-lock module 20. Accordingly, the transfer device 70 receives the edge ring assembly E from the support pins in the load-lock module 20 and supports the heat transfer sheet of the edge ring assembly E. Next, the transfer arm 71 is retreated from the load-lock module 20, so that the edge ring assembly E is transferred from the load-lock module 20 to the transfer module 50.

Next, the gate valve 61 of the desired processing module 60 is opened. Then, the transfer arm 71 supporting the heat transfer sheet E2 of the edge ring assembly E is inserted into the pressure-reduced plasma processing chamber 100 through a loading/unloading port, and the edge ring assembly E is transferred to a position above the ring supporting surface 104b of the electrostatic chuck 104. In other words, the transfer device 70 supports the heat transfer sheet E2 of the edge ring assembly E, and transfers the edge ring assembly E to the position above the ring supporting surface 104b of the electrostatic chuck 104.

Next, the lifting pins 107 are raised to receive the edge ring assembly E from the transfer arm 71, and the heat transfer sheet E2 is supported. In other words, the lifting pins 107 receive the edge ring assembly E from the transfer device 70 and support the heat transfer sheet E2 of the edge ring assembly E.

Then, the transfer arm 71 is retreated from the plasma processing chamber 100. At the same time, the lifting pins 107 are lowered, and the heat transfer sheet E2 of the edge ring assembly E is placed on the ring supporting surface 104b of the electrostatic chuck 104. In other words, the electrostatic chuck 104 receives the edge ring assembly E from the lifting pins 107 such that the edge ring E1 is placed on the ring supporting surface 104b via the heat transfer sheet E2.

Then, a DC voltage is applied to the electrode 109 disposed at the peripheral portion of the electrostatic chuck 104, and the edge ring E1 is attracted and held onto the ring supporting surface 104b via the heat transfer sheet E2 by the electrostatic force generated by the DC voltage. Specifically, for example, different voltages are applied to the electrodes 109a and 109b, and the edge ring E1 is attracted and held onto the ring supporting surface 104b via the heat transfer sheet E2 by the electrostatic force generated according to a potential difference thus generated.

In this manner, a series of the installation processes of the edge ring E1 is completed. As clearly described above, the plasma processing chamber 100 of the processing module 60 where the edge ring E1 is replaced is not exposed (opened) to the atmosphere during the installation processes of the edge ring E1 of the present embodiment.

The separation process of the edge ring E1 is performed in the reverse order of the installation processes of the edge ring E1. Therefore, the edge ring E1 is separated together with the heat transfer sheet E2. In other words, the edge ring E1 is separated by separating the edge ring assembly E. In the case of separating the edge ring E1, the edge ring assembly E may be unloaded from the plasma processing chamber 100 after the edge ring E1 may be cleaned.

Next, the peelability improving treatment will be described.

As described above, the surfaces in the container 31b, the surface of the transfer arm 41, the surface of the transfer arm 71, the surface of the wafer support 101, and the surfaces of the lifting pins 107 that support the heat transfer sheet E2 of the edge ring assembly E are subjected to the peelability improving treatment.

The peelability improving treatment is, for example, embossing treatment or flattening treatment.

In the embossing treatment, convex portions are formed on a processing target surface to reduce a contact area between the processing target surface and the heat transfer sheet E2. Specifically, in the embossing treatment, hemispherical convex portions having a diameter greater than or equal to 10 μm and smaller than or equal to 100 μm are formed such that the ratio of the area of the convex portions to the entire processing target surface becomes a predetermined ratio.

Alternatively, cylindrical convex portions having the same size may be formed instead of the hemispherical convex portions.

The predetermined ratio varies depending on the processing target surface. For the wafer support 101 (the ring supporting surface 104*b*), the predetermined ratio is higher than or equal to 50% and lower than or equal to 80%. By setting the predetermined ratio to be lower than or equal to 80%, high peelability can be obtained. By setting the predetermined ratio to be higher than or equal to 50%, sufficient thermal conductivity can be obtained between the wafer support 101 and the edge ring E1.

Further, for the surfaces of the members other than the surface of the wafer support 101 (the ring supporting surface 104*b*), such as the container 31*b*, the transfer arm 41, the transfer arm 71, and the lifting pins 107, the predetermined ratio is, for example, higher than or equal to 20% and lower than or equal to 50%. At this ratio, high peelability can be obtained.

That is, in the present embodiment, the predetermined ratio for the region where the convex portions are formed may be different between the ring supporting surface 104*b* of the wafer support 101 and the other members.

In the flattening treatment, the processing target surface is flattened to reduce the number of fine irregularities (irregularities smaller than those formed by the embossing treatment). By performing the flattening treatment, it is possible to reduce an anchor effect in which the heat transfer sheet E2 enters the fine irregularities, which causes the reduction of the peelability. For example, the flattening treatment is preferably performed such that the surface roughness of the processing target surface becomes 1 μm or less in arithmetic mean roughness.

In the peelability improving treatment, the processing target surface may be coated with a material having high peelability. Further, in the peelability improving treatment, a portion including the processing target surface may be formed using a material having high peelability. The material having high peelability is, for example, silicone resin, fluororesin, or ceramic.

The peelability improving treatment may be performed differently depending on a type of the processing target surface. Specifically, for example, the flattening treatment may be performed as the peelability improving treatment on the wafer support 101 where both of the thermal conductivity and the peelability are significant, and the embossing treatment may be performed as the peelability improving treatment on, for example, the transfer arm 41 where the peelability is primarily significant.

As described above, the method for replacing the edge ring E1 of the present embodiment includes the following steps (A) to (C):

(A) a step in which the transfer device 70 supports the heat transfer sheet E2 of the edge ring assembly E and moves the edge ring assembly E to the position above the wafer support 101, (B) a step in which the lifting pins 107 receive the edge ring assembly E from the transfer device 70 and support the heat transfer sheet E2 of the edge ring assembly E, (C) a step in which the wafer support 101 receives the edge ring assembly E from the lifting pins 107 such that the edge ring E1 is placed on the wafer support 101 via the heat transfer sheet E2.

In the method for replacing the edge ring of the present embodiment, the above steps (A) to (C) are performed without exposing the plasma processing chamber 100 to the atmosphere. Accordingly, the edge ring E1 can be disposed on the wafer support 101 together with the heat transfer sheet E2. By using this installation method, the edge ring E1 can be separated from the wafer support 101 together with the heat transfer sheet E2 in the reverse order without exposing the plasma processing chamber 100 to the atmosphere.

Therefore, in the present embodiment, in the processing module 60 where the heat transfer sheet E2 is disposed between the edge ring E1 and the wafer support 101, the edge ring E1 and the heat transfer sheet E2 can be replaced without exposing the plasma processing chamber 100 to the atmosphere. Accordingly, it is possible to reduce the time required from the replacement of the edge ring E1 to the restart of the plasma processing.

Further, in the method for replacing the edge ring E1 of the present embodiment, since the edge ring E1 is separated as the edge ring assembly E is separated, the heat transfer sheet E2 does not remain on the wafer support 101. Therefore, the heat transfer sheet E2 disposed between the edge ring E1 and the wafer support 101 does not deteriorate. Further, it is possible to prevent the subsequent plasma processing from being adversely affected by the heat transfer sheet E2 remaining on the wafer support 101.

As described above, the surface of the wafer support 101 or the like that supports the heat transfer sheet E2 of the edge ring assembly E may be subjected to the peelability improving treatment. By performing the peelability improving treatment, it is possible to reduce the possibility that the heat transfer sheet E2 partially remains on the surface that supports the heat transfer sheet E2 or the edge ring E1 bounces at the time of separating the edge ring E1 by separating the edge ring assembly E from the ring supporting surface 104*b*.

Further, the peelability improving treatment may be performed on the surfaces of the support pins in the load-lock module 20 that support the heat transfer sheet E2 of the edge ring assembly E.

Further, in the present embodiment, no gas supply hole for supplying the heat transfer gas is formed at the ring supporting surface 104*b* of the wafer support 101. In other words, no heat transfer gas is used at the time of placing and holding the edge ring E1 on the ring supporting surface 104*b*. Therefore, the present embodiment provides the following effects.

Unlike the technique of the present embodiment, in the technique in which the heat transfer gas is supplied to the space between the edge ring and the ring supporting surface of the wafer support instead of using the heat transfer sheet for temperature control of the edge ring, the edge ring may not be controlled to a desired temperature when the large heat input is applied from the plasma to the edge ring. This is because the edge ring and the wafer support are considerably deformed by the large heat input, so that the gap therebetween becomes large and the heat transfer gas leaks out. This results in the reduction of the heat transferability between the edge ring and the wafer support. On the other hand, in the present embodiment, the heat transfer gas is not used, and even if the edge ring E1 and the wafer support 101 are considerably expanded due to the heat input from the plasma, the heat transfer sheet E2 can follow such expansion. Therefore, no gap is formed between the edge ring E1 and the wafer support 101, so that the edge ring E1 can be controlled to a desired temperature via the wafer support 101.

Conventionally, helium gas is used as an example of the heat transfer gas. However, in the present embodiment, helium gas that is expensive is not used as the heat transfer gas. Thus, cost reduction can be achieved.

However, the present disclosure does not limit the formation of the gas supply hole at the ring supporting surface 104*b* in the case of supplying the heat transfer gas toward the heat transfer sheet E2. For example, if the embossing treatment is performed as the peelability improving treatment on the ring supporting surface 104*b*, a gap may be formed between the ring supporting surface 104*b* and the heat transfer sheet E2. Therefore, the heat transfer gas may be supplied to this gap.

Further, in the method for replacing the edge ring E1 of the present embodiment, the heat transfer sheet E2 of the edge ring assembly E is maintained to face downward during the steps (A) to (C). In other words, when the edge ring E1 is replaced by separating the edge ring assembly E, it is not necessary to turn the edge ring assembly E upside down such that the back surface (the surface on the heat transfer sheet E2 side) and the front surface (the surface opposite to the heat transfer sheet E2 side) of the edge ring assembly E are reversed (that is, the edge ring assembly is maintained right side up). Therefore, a reverser (also referred to as reversing device) for turning the edge ring assembly E upside down is not required. Accordingly, the plasma processing system 1 can be scaled down in size compared to the case where the reversing device is provided. Particularly, when the reversing device is provided in a member (module) of the plasma processing system 1 set to a pressure-reduced atmosphere, it is necessary to provide a large exhaust device to exhaust the space in the member where the reversing device is accommodated. On the other hand, in the present embodiment, the processing system 1 can be scaled down in size.

Figure 8:
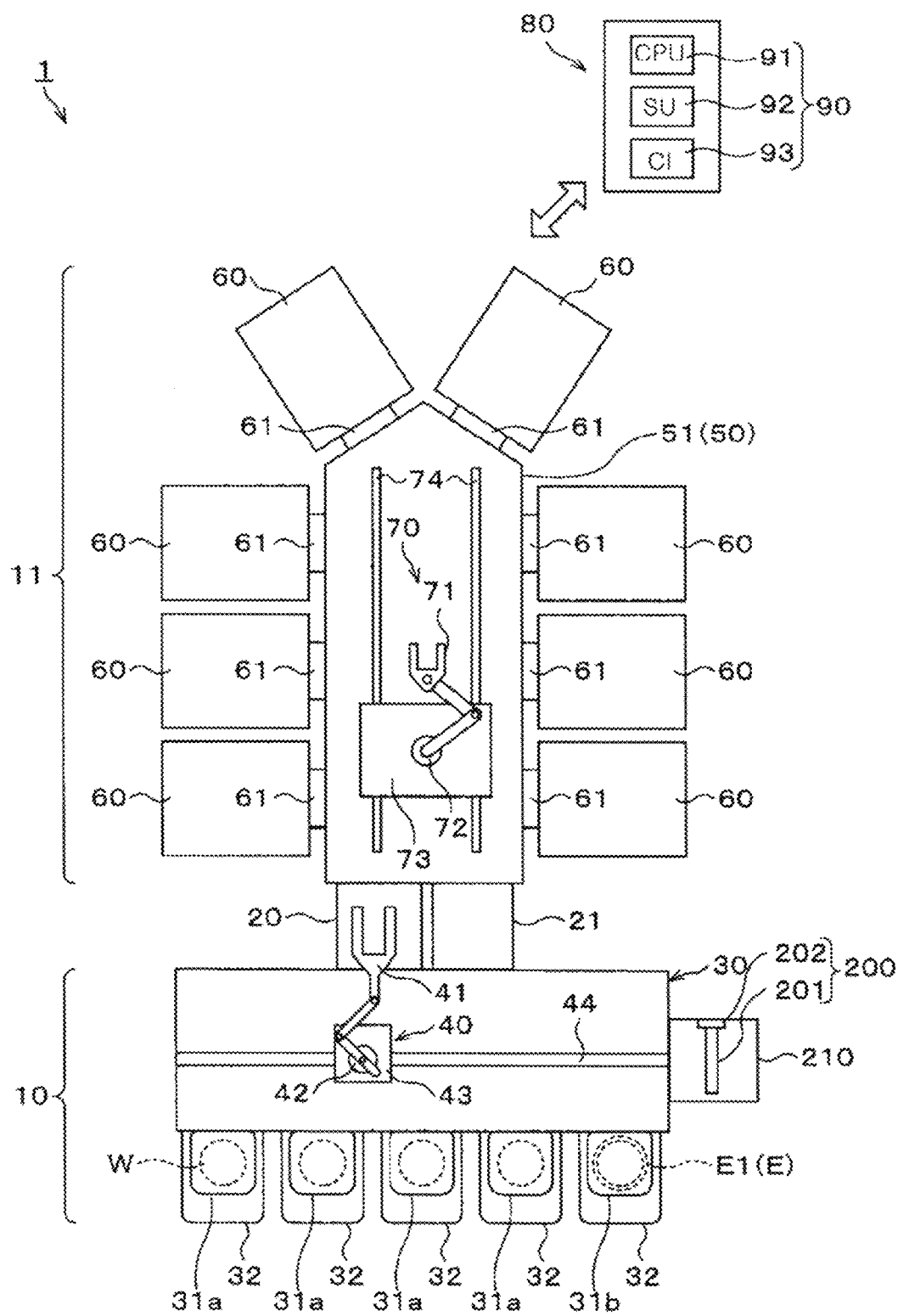
FIG. 8 shows an example of an arrangement position of a reversing device.
Figure 9:
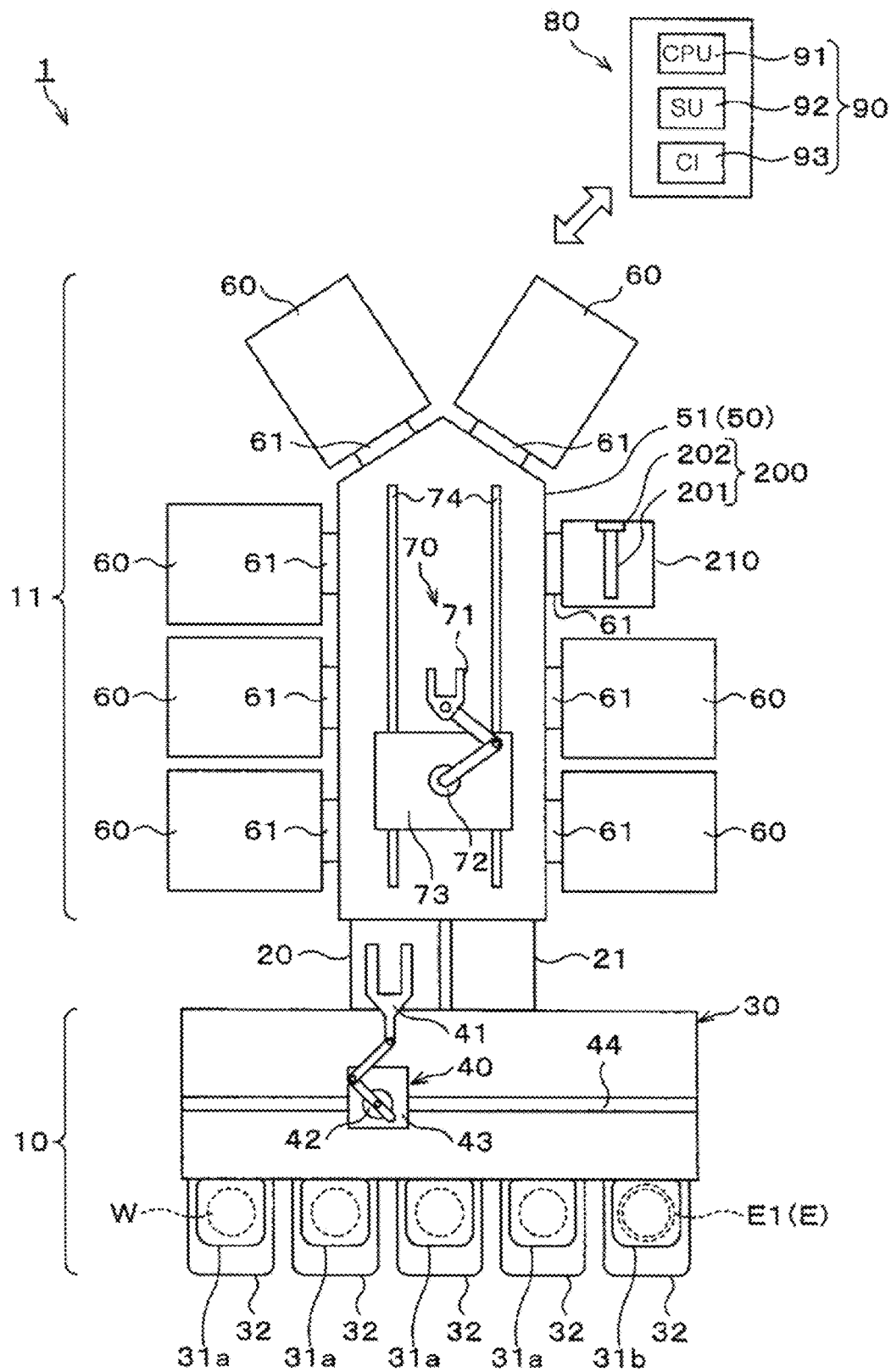
FIG. 9 shows another example of the arrangement position of the reversing device.

However, the present disclosure does not limit the installation of the above-described reversing device in the plasma processing system 1. For example, in the container 31*b* where the edge ring assembly E is stored, when the side of the edge ring assembly E opposite to the heat transfer sheet E2 side, i.e., the front surface of the edge ring assembly E, is supported on the upper surface of the shelf F11, the above-described reversing device may be provided. In this case, the reversing device may be provided in a member (module) of the plasma processing system 1 maintained in an atmospheric pressure atmosphere or in a member (module) of the plasma processing system 1 set to a pressure-reduced atmosphere. Specifically, as shown in FIG. 8, for example, the reversing device 200 may be provided in a module 210 connected to the loader module 30 of the atmospheric section 10. Further, as shown in FIG. 9, the reversing device 200 may be provided in the module 210 connected to the transfer module 50 of the decompression section 11.

The reversing device 200 includes, e.g., a holding member 201 for holding the front surface or the back surface of the edge ring assembly E, and a driving unit 202 that generates a driving force for rotating the holding member 201 holding the edge ring assembly E. The driving unit 202 has a driving assembly or a driving mechanism (e.g., an actuator, a motor and/or other devices) that generates a driving force.

The surface of the reversing device 200 that supports the heat transfer sheet E2 of the edge ring assembly E, specifically, the surface of the holding member 201 that supports the heat transfer sheet E2 of the edge ring assembly E, may be subjected to the peelability improving treatment.

Figure 10:
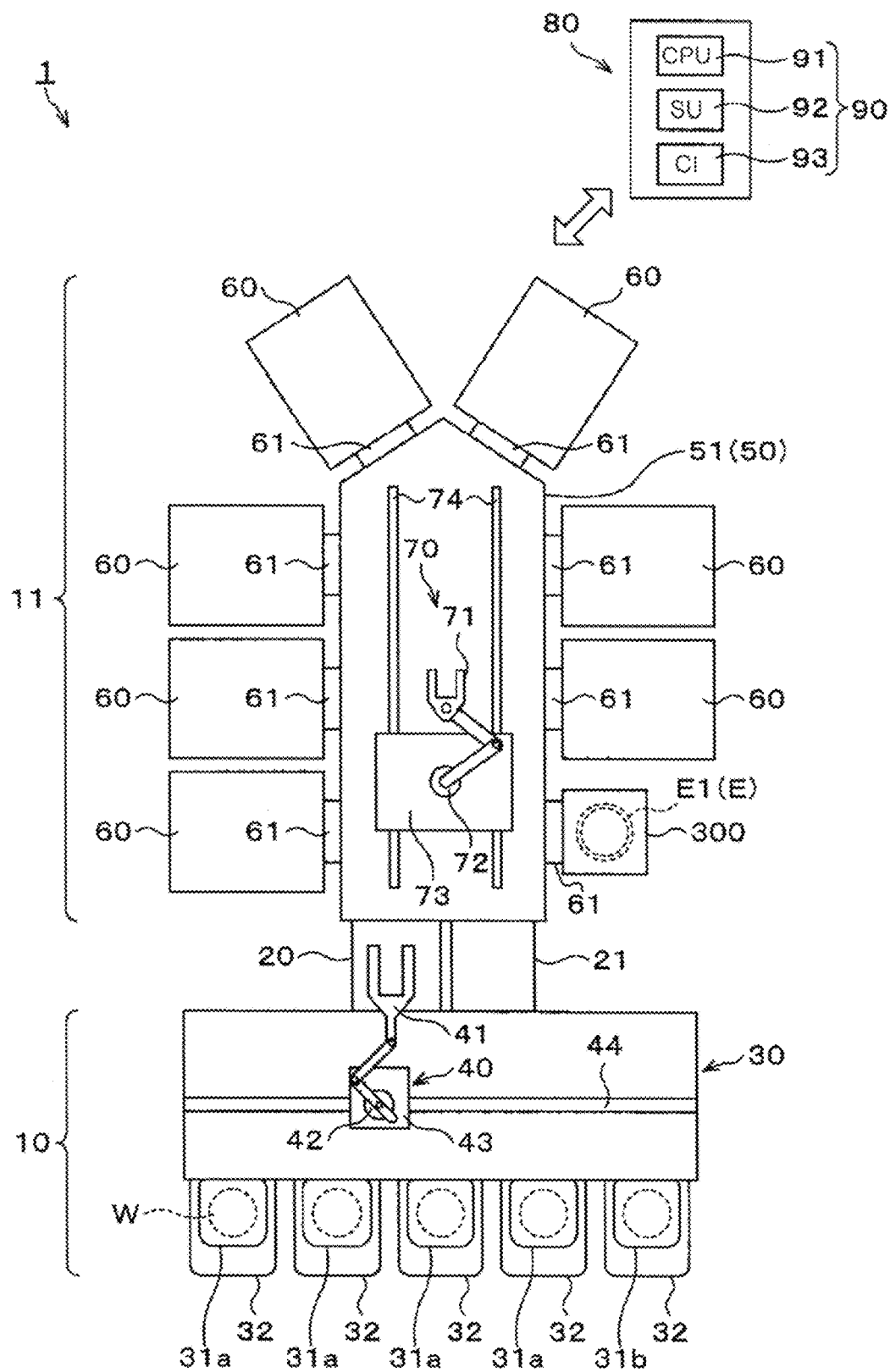
FIG. 10 shows an example of a storage module.

In the above example, the edge ring assembly E for replacement is stored in the container 31*b* in an atmospheric pressure atmosphere. Instead, as shown in FIG. 10, for example, a storage structure (also referred to as a storage module) 300 serving as a storage module whose inner space is maintained in a pressure-reduced atmosphere may be connected to the transfer module 50, and the edge ring assembly E may be stored in the storage module 300 in the pressure-reduced atmosphere. Although it is not illustrated, the storage module 300 has a plurality of shelves, similarly to the container 31*b*, for example. When the upper surfaces of the shelf support the heat transfer sheet E2 of the edge ring assembly E, the upper surfaces may be subjected to the peelability improving treatment.

Figure 11:
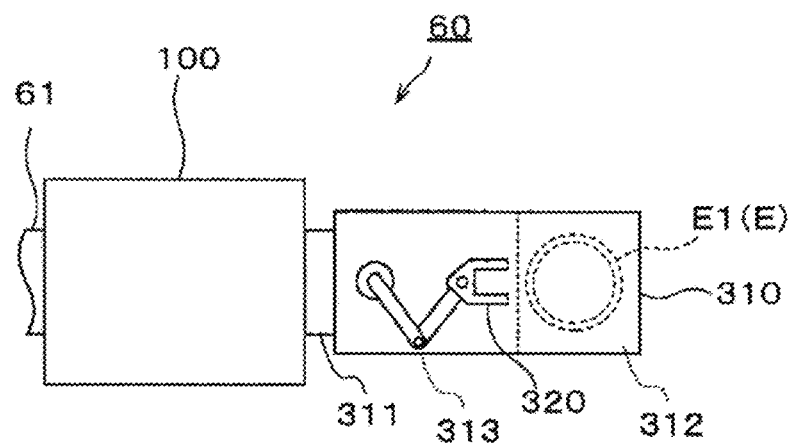
FIG. 11 shows another example of the storage module.

Further, as shown in FIG. 11, a storage module 310 where the edge ring assembly E is stored in a pressure-reduced atmosphere may be connected to the processing module 60. In this case, the storage module 310 is connected to the plasma processing chamber 100 of the processing module 60 through a gate valve 311.

The storage module 310 includes, for example, a storage chamber 312 serving as a storage unit on a rearmost side of the plasma processing chamber 100 and a pressure-reducible transfer chamber 313 on a front side of the storage chamber 312. The storage chambers 312 and the pressure-reducible transfer chamber 313 are integrated with each other. The inner spaces of the storage chamber 312 and the pressure-reducible transfer chamber 313 are maintained in a pressure-reduced atmosphere.

The edge ring assembly E is stored in the storage chamber 312 in a pressure-reduced atmosphere. Although it is not illustrated, a plurality of shelves is provided inside the storage chamber 312, similar to the container 31*b*, for example.

The pressure-reducible transfer chamber 313 is connected to the plasma processing chamber 100 through the gate valve 311, and a transfer device 320 having the same configuration as that of transfer device 70 is disposed in the pressure-reducible transfer chamber 313. In the case of replacing the edge ring E1, the transfer device 320 transfers the edge ring assembly E between the storage chamber 312 and the plasma processing chamber 100 through the pressure-reducible transfer chamber 313.

It is also possible to omit the transfer device 320 and extend the transfer arm 71 of the transfer device 70 in the transfer module 50 to transfer the edge ring assembly E between the storage chamber 312 and the plasma processing chamber 100 using the transfer device 70.

Figure 12:
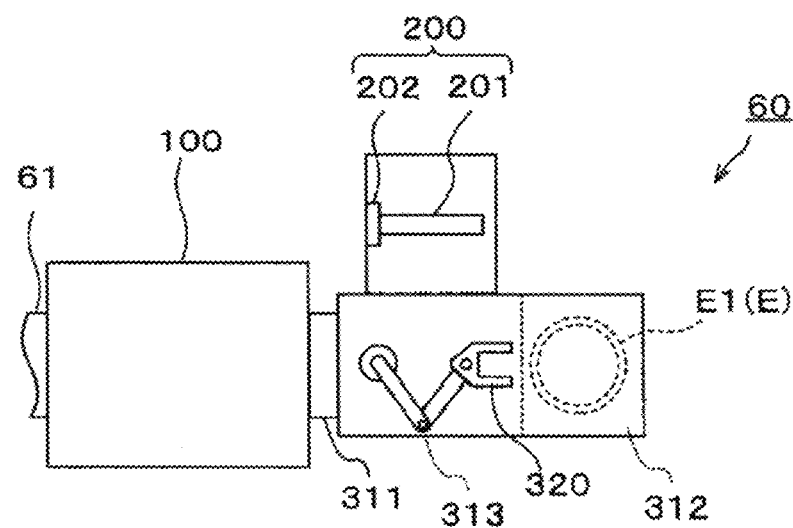
FIG. 12 shows still another example of the storage module.

Further, as shown in FIG. 12, the reversing device 200 may be provided at a region of the storage module 310 adjacent to the pressure-reducible transfer chamber 313.

When the storage module 310 is provided as shown in FIGS. 11 and 12, the surfaces of the shelves in the storage chamber 312, the transfer device 320 in the pressure-reducible transfer chamber 313, and the reversing device 200 that support the heat transfer sheet E2 of the edge ring assembly E may be subjected to the peelability improving treatment.

In the above-described embodiments, the surface of the ring supporting surface 104*b* of the wafer support 101 or the like that supports the heat transfer sheet E2 of the edge ring assembly E may be subjected to the peelability improving treatment. Instead or in addition thereto, the back surface of the heat transfer sheet E2 that is opposite to the surface in contact with the edge ring E1 may be subjected to the peelability improving treatment.

The peelability improving treatment performed on the back surface of the heat transfer sheet E2 is, e.g., a treatment in which powders or fibers of the heat transfer material are mixed. The heat transfer material is, e.g., nitride such as aluminum nitride, silicon (Si), or silicon carbide (SiC).

Further, the peelability improving treatment performed on the back surface of the heat transfer sheet E2 is a treatment for making the contact area between the back surface of the heat transfer sheet E2 and the ring supporting surface 104b smaller than the contact area between the front surface of the heat transfer sheet E2 and the edge ring E1. For example, a treatment for forming recesses on the back surface of the heat transfer sheet E2 may be performed.

Figure 13:
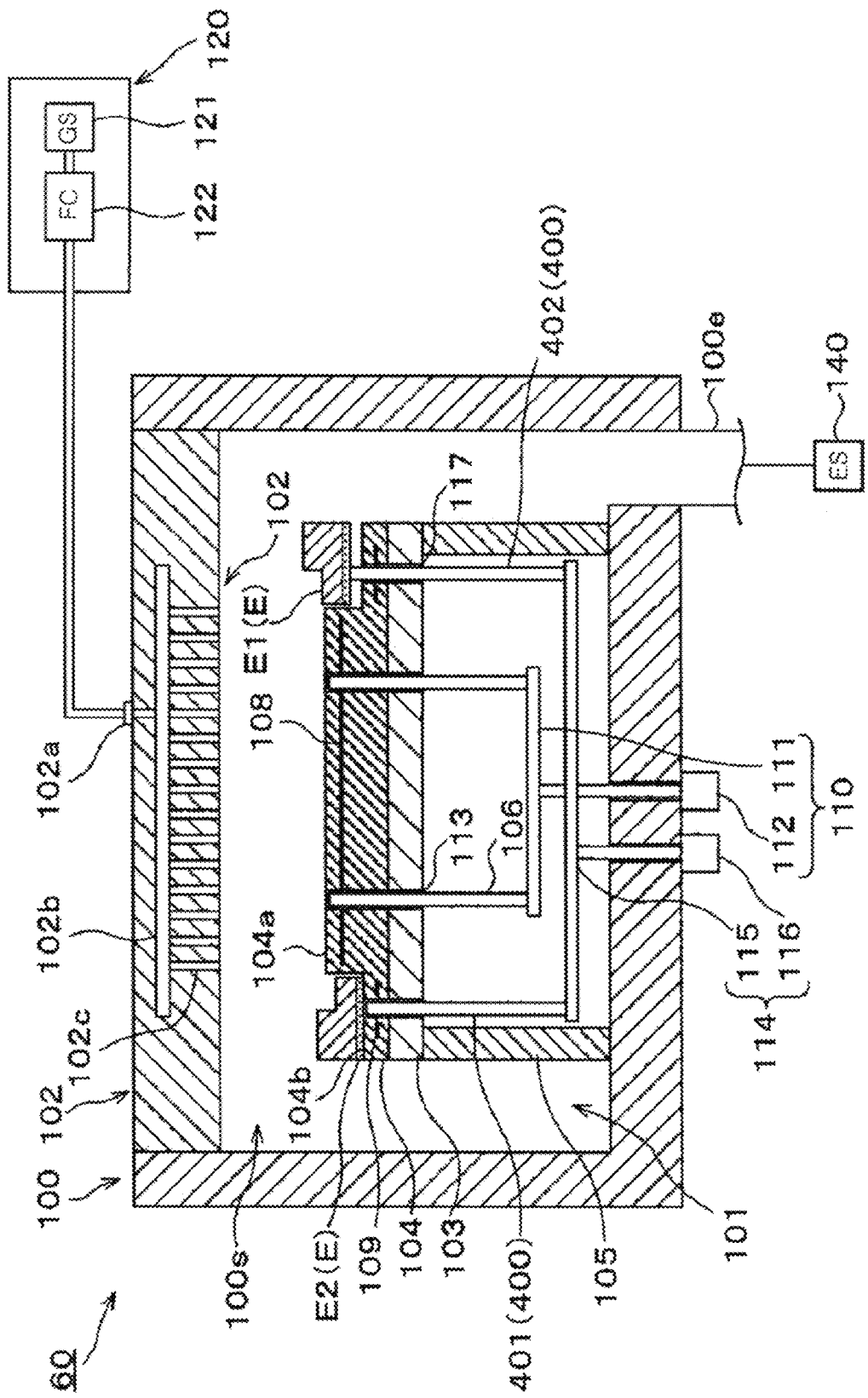
FIG. 13 shows another example of lifting pins.

FIG. 13 explains another example of the lifting pins.

The lifting pins 107 in the example of FIG. 6 have the same length. Therefore, when the lifting pins 107 are raised and the edge ring assembly E is separated from the ring supporting surface 104b of the wafer support 101 by the lifting pins 107, the entire edge ring assembly E is substantially simultaneously separated.

On the other hand, lifting pins 400 in the example of FIG. 13 have a short lifting pin 401 and a long lifting pin 402. Therefore, when the lifting pins 400 are raised, the long lifting pin 402 first comes into contact with the edge ring assembly E. Hence, when the edge ring assembly E is separated from the ring supporting surface 104b, only one end of the edge ring assembly E is first separated. Accordingly, it is possible to prevent the edge ring assembly E from bouncing when separating the edge ring assembly E from the ring supporting surface 104b. The difference in the lengths between the lifting pin 401 and the lifting pin 402 is set such that the edge ring assembly E is not misaligned when the edge ring assembly E is supported by the lifting pins 400.

Alternatively, it is possible to make the lengths of the lifting pins the same and provide a driving unit to generate a driving force for vertical movement for each of the lifting pins so that only one end of the edge ring assembly E can be separated first from the ring supporting surface 104b.

Figure 14:
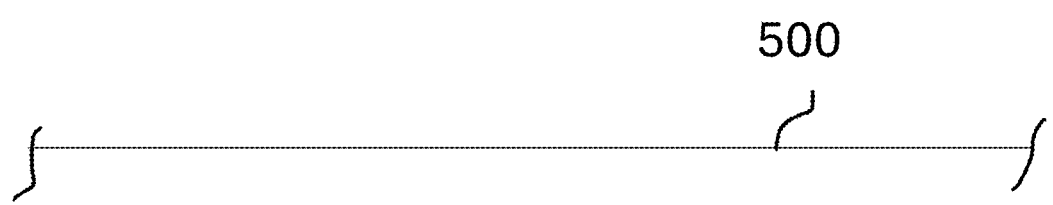
FIG. 14 shows an example of a surface.

FIG. 14 is an example of a surface 500 that can include convex portions or a coating. The coating can be made of silicon resin, fluororesin, or ceramic. The surface 500 can be, for example, a surface of the transferer to support the edge ring assembly, a surface of the delivery structure that supports the edge ring assembly, a surface of the storage structure that supports the edge ring assembly, a surface of a different transferer that supports the edge ring assembly, a surface of a container that supports the stored edge ring assembly, a surface of a heat transfer sheet, a ring supporting surface of the support that supports the edge ring assembly, and/or a processing target surface.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing system comprising:
a plasma processing apparatus configured to perform plasma processing on a substrate; and
a pressure-reducible transfer apparatus connected to the plasma processing apparatus,
wherein the plasma processing apparatus includes:
a pressure-reducible processing chamber;
an electrostatic chuck disposed in the processing chamber, the electrostatic chuck having a support surface having thereon an edge ring assembly that includes a heat transfer sheet that is attached to an edge ring, and the edge ring surrounding the substrate supported by the support surface, wherein a surface of the heat transfer sheet opposite to a surface in contact with the edge ring includes a silicone resin or fluororesin coating to improve peelability;
an electrode is arranged in the electrostatic chuck, which is below the support surface on which the edge ring assembly is placed, to electrostatically attract and hold the edge ring, wherein the support surface on which the edge ring assembly is placed is formed without having a heat transfer gas supply hole; and
a delivery structure to vertically move the edge ring assembly to transfer the edge ring assembly between the plasma processing apparatus and the pressure-reducible transfer apparatus,
wherein the pressure-reducible transfer apparatus includes:
a pressure-reducible transfer chamber connected to the processing chamber; and
a transferer to transfer the edge ring assembly between the processing chamber and the pressure-reducible transfer chamber,
wherein, without exposing the processing chamber to the atmosphere,
the transferer supports the heat transfer sheet of the edge ring assembly and moves the edge ring assembly to a position above the support surface,
the delivery structure receives the edge ring assembly from the transferer and supports the heat transfer sheet of the edge ring assembly, and
the support surface receives the edge ring assembly from the delivery structure such that the edge ring is placed on the support surface via the heat transfer sheet.

2. The plasma processing system of claim 1, wherein the edge ring assembly is maintained right side up while at least in a pressure-reduced atmosphere in the plasma processing system until the edge ring assembly is received on the support surface, wherein right side up is where the edge ring is located above the heat transfer sheet relative to a base of the processing chamber.

3. The plasma processing system of claim 1, wherein a surface of the delivery structure that supports the edge ring assembly includes convex portions, or a coating made of silicone resin or fluororesin to improve peelability.

4. The plasma processing system of claim 3, wherein the convex portions have a diameter greater than or equal to 10 µm and smaller than or equal to 100 µm.

5. The plasma processing system of claim 3, wherein the convex portions are hemispherical.

6. The plasma processing system of claim 3, wherein the convex portions are cylindrical.

7. The plasma processing system of claim 1, further comprising:
a storage structure that is connected to the pressure-reducible transfer chamber and stores the edge ring assembly in a pressure-reduced atmosphere,
wherein a surface in the storage structure that supports the edge ring assembly includes a coating made of silicone resin or fluororesin to improve peelability.

8. The plasma processing system of claim 1, further comprising:
an atmospheric transferer connected to the pressure-reducible transfer apparatus,
wherein the atmospheric transferer includes:

a container mounter on which a container that stores the edge ring assembly in an atmospheric pressure atmosphere is placed, and a different transferer to transfer the edge ring assembly between the container mounter and the pressure-reducible transfer apparatus.

9. The plasma processing system of claim 8, wherein a surface of the different transferer that supports the edge ring assembly includes a coating made of silicone resin or fluororesin to improve peelability.

10. The plasma processing system of claim 8, wherein a surface in the container that supports the stored edge ring assembly includes a coating made of silicone resin or fluororesin to improve peelability.

11. The plasma processing system of claim 1, wherein a ring supporting surface of the support that supports the edge ring assembly includes a coating made of silicone resin or fluororesin to improve peelability.

12. The plasma processing system of claim 1, wherein the support surface supporting the edge ring assembly is a flat surface to reduce a number of fine irregularities such that a surface roughness of the flat surface becomes 1 μm or less in arithmetic mean roughness.

\* \* \* \* \*